US012278124B2

(12) United States Patent
Lischer et al.

(10) Patent No.: US 12,278,124 B2
(45) Date of Patent: Apr. 15, 2025

(54) MODEL-BASED CONTROLLED LOAD LOCK PUMPING SCHEME

(71) Applicant: Applied Materials, Inc., Santa Clara, CA (US)

(72) Inventors: D. Jeffrey Lischer, Acton, MA (US); Bon-Woong Koo, Andover, MA (US); Dawei Sun, Lynnfield, MA (US); Chi-Yang Cheng, West Lebanon, NH (US); Paul Joseph Murphy, Reading, MA (US); Frank Sinclair, Boston, MA (US); Gregory Edward Stratoti, Sandown, NH (US); Tseh-Jen Hsieh, Rowley, MA (US); Wayne Chen, Brookline, MA (US); Guy Oteri, Merrimac, MA (US)

(73) Assignee: Applied Materials, Inc., Santa Clara, CA (US)

( * ) Notice: Subject to any disclaimer, the term of this patent is extended or adjusted under 35 U.S.C. 154(b) by 744 days.

(21) Appl. No.: 17/513,241

(22) Filed: Oct. 28, 2021

(65) Prior Publication Data

US 2023/0138326 A1 May 4, 2023

(51) Int. Cl.
*H01L 21/67* (2006.01)
*G05D 22/02* (2006.01)

(52) U.S. Cl.
CPC ....... *H01L 21/67201* (2013.01); *G05D 22/02* (2013.01)

(58) Field of Classification Search
CPC ......... H01L 21/67201; H01L 21/67017; H01L 21/67248; H01L 21/67253; G05D 22/02

(Continued)

(56) References Cited

U.S. PATENT DOCUMENTS 3,599,862 A * 8/1971 Hogan .................... G05D 22/02
165/230
5,833,425 A * 11/1998 Jeon ...................... C23C 14/566
414/217

(Continued)

FOREIGN PATENT DOCUMENTS

KR 2008-0009568 A 1/2008
TW 202008094 A 2/2020

(Continued)

OTHER PUBLICATIONS

International Search Report and Written Opinion mailed Feb. 3, 2023 in corresponding PCT application No. PCT/US2022/045794.

(Continued)

*Primary Examiner* — Steven S Anderson, II
*Assistant Examiner* — Frances F. Hamilton
(74) *Attorney, Agent, or Firm* — Nields, Lemack & Frame, LLC

(57) ABSTRACT

A load lock in which the pumping speed is controlled so as to minimize the possibility of condensation is disclosed. The load lock is in communication with a vacuum pump and a valve. A controller is used to control the valve such that the supersaturation ratio within the load lock does not exceed a predetermined threshold, which is less than or equal to the critical value at which vapor condenses. In certain embodiments, a computer model is used to generate a profile, which may be a pumping speed profile or a pressure profile, and the valve is controlled according to the profile. In another embodiment, the load lock comprises a temperature sensor and a pressure sensor. The controller may calculate the supersaturation ratio based on these parameters and control the valve accordingly.

18 Claims, 6 Drawing Sheets

(58) Field of Classification Search
USPC ......... 454/184; 361/689, 690, 691, 695, 696
See application file for complete search history.

(56) References Cited

U.S. PATENT DOCUMENTS

| | | | | |
|---|---|---|---|---|
| 6,015,465 | A * | 1/2000 | Kholodenko | H01L 21/67248 118/712 |
| 6,077,157 | A * | 6/2000 | Fairbairn | C23C 16/54 454/49 |
| 6,329,297 | B1 * | 12/2001 | Balish | H01J 37/3244 156/345.35 |
| 6,332,724 | B1 * | 12/2001 | Yano | H01L 21/67248 118/69 |
| 2001/0000198 | A1 * | 4/2001 | Takeshita | B05D 3/0453 118/716 |
| 2004/0045184 | A1 * | 3/2004 | Takeshita | B05D 3/0453 34/218 |
| 2004/0187452 | A1 | 9/2004 | Edo | |
| 2005/0183823 | A1 * | 8/2005 | Yonekawa | G03F 7/70858 156/345.31 |
| 2006/0102237 | A1 * | 5/2006 | Le Guet | H01L 21/67772 137/561 R |
| 2008/0298933 | A1 * | 12/2008 | Hsiao | H01L 21/67017 414/172 |
| 2011/0097902 | A1 * | 4/2011 | Singh | H01L 21/67201 257/E21.328 |
| 2014/0004626 | A1 * | 1/2014 | Xu | H01L 21/302 257/E21.528 |
| 2014/0106571 | A1 * | 4/2014 | Koo | H01J 37/32862 438/758 |
| 2014/0272179 | A1 * | 9/2014 | Radovanov | H01J 37/3171 427/523 |
| 2017/0125272 | A1 * | 5/2017 | van Gogh | H01L 21/67178 |
| 2020/0192325 | A1 | 6/2020 | Sadeghi et al. | |
| 2020/0219744 | A1 * | 7/2020 | Kim | H01L 21/67739 |
| 2021/0262577 | A1 | 8/2021 | Sato et al. | |
| 2022/0301893 | A1 * | 9/2022 | Wei | H01L 21/67742 |
| 2023/0048337 | A1 | 2/2023 | Medure et al. | |
| 2023/0194392 | A1 * | 6/2023 | Pugliese, Jr. | H01L 21/67201 73/25.04 |
| 2023/0197472 | A1 * | 6/2023 | Kraus | C23C 16/4408 34/487 |
| 2023/0317478 | A1 * | 10/2023 | Decottignies | H01L 21/67184 118/729 |

FOREIGN PATENT DOCUMENTS

| | | | | |
|---|---|---|---|---|
| WO | WO-2011077344 | A2 * | 6/2011 | ....... H01L 21/67253 |
| WO | 2019/076553 | A1 | 4/2019 | |

OTHER PUBLICATIONS

Kobayashi, "Reducing Particle Contamination During Pump-down in Load Lock Chamber", Journal of the Vacuum Society of Japan, vol. 53, pp. 568-572, Dec. 2010.

* cited by examiner

MODEL-BASED CONTROLLED LOAD LOCK PUMPING SCHEME

FIELD

Embodiments of the present disclosure relate to a load lock, and more particularly, to a load lock that minimizes condensation during the pumping process.

BACKGROUND

Load locks are used to transfer a material from a first environment to a second environment, where the pressure within the first environment differs from that in the second environment. Often, a load lock is used to interface a high vacuum environment with an atmospheric environment. When transitioning from the atmospheric environment, the load lock opens to accept the material. Once the load lock closed, the air is exhausted from the sealed chamber. The load lock then opens to allow the material to be removed in the high vacuum environment. When transitioning from the high vacuum environment, the load lock introduces air to return the chamber to atmospheric pressure before opening.

In certain embodiments, as air is exhausted from the load lock, the temperature within the load lock may decrease. If the temperature drop is too great, it is possible that condensation of water vapor may occur. This may occur if the supersaturation ratio exceeds a critical value at which vapor condenses. Condensation may result in the formation of particles on the workpieces, which may manifest themselves as defects after processing. This reduces yield and efficiency.

This issue may be mitigated by slowing the rate at which the load lock is exhausted. A slower change in pressure creates a smaller drop in temperature, which may reduce the possibility or amount of condensation. However, while effective in reducing particles, this approach implies that the workpieces spend more time in the load lock, which affects overall throughput.

Therefore, it would be beneficial if there were a load lock that reduced the likelihood of condensation, but did not add significant time to the pumping process. Further, it would be advantageous if this load lock was adaptable to different environmental conditions and implant conditions.

SUMMARY

A load lock in which the pumping speed is controlled so as to minimize the possibility of condensation is disclosed. The load lock is in communication with a vacuum pump and a valve. A controller is used to control the valve such that the supersaturation ratio within the load lock does not exceed a predetermined threshold, which is less than or equal to the critical value at which vapor condenses. In certain embodiments, a computer model is used to generate a profile, which may be a pumping speed profile or a pressure profile, and the valve is controlled according to the profile. In another embodiment, the load lock comprises a temperature sensor and a pressure sensor. The controller may calculate the supersaturation ratio based on these parameters and control the valve accordingly.

According to one embodiment, a system for introducing workpieces to a semiconductor processing tool is disclosed. The system comprises a load lock; a vacuum pump; a valve between the load lock and the vacuum pump; and a controller, comprising a memory element storing a plurality of profiles, each profile associated with a respective relative humidity; wherein an operating relative humidity is supplied to the controller, the controller selects one of the plurality of profiles based on the operating relative humidity, referred to as a selected profile; and controls the valve based on the selected profile. In certain embodiments, the profile comprises a pumping speed profile. In some embodiments, the profile comprises a pressure profile. In certain embodiments, the system comprises a pressure sensor in communication with an interior of the load lock, and the controller controls the valve based on a pressure measured by the pressure sensor and the selected profile. In some embodiments, the profile is created using a computer model. In some embodiments, the computer model is created so as to maintain a supersaturation ratio within the load lock at or below a supersaturation ratio threshold, which is less than or equal to a critical value at which vapor condenses. In certain embodiments, the computer model is created using differential equations. In some embodiments, the computer model is created using computational fluid dynamics.

According to another embodiment, a semiconductor processing system is disclosed. The semiconductor processing system comprises a semiconductor processing tool and the system described above.

According to another embodiment, a system for introducing workpieces to a semiconductor processing tool is disclosed. The system comprises a load lock; a vacuum pump; a valve between the load lock and the vacuum pump; and a controller, comprising a memory element storing a profile, the profile created by a computer model such that a supersaturation ratio within the load lock is maintained at or below a supersaturation ratio threshold, which is less than or equal to a critical value at which vapor condenses and such that a pump down time is less than twice a theoretical minimum pump down time, wherein the theoretical minimum pump down time is defined as a time to pump down the load lock from atmospheric pressure to vacuum conditions while the supersaturation ratio within the load lock remains constant at the critical value; wherein the controller controls the valve based on the profile. In some embodiments, the profile comprises a pressure profile. In certain embodiments, the system comprises a pressure sensor in communication with an interior of the load lock, wherein the controller controls the valve based on a pressure measured by the pressure sensor and the profile. In some embodiments, the profile comprises a pumping speed profile. In certain embodiments, the computer model is created using differential equations. In some embodiments, the computer model is created using computational fluid dynamics.

According to another embodiment, a system for introducing workpieces to a semiconductor processing tool is disclosed. The system comprises a load lock; a vacuum pump; a pressure sensor in communication with an interior of the load lock; a temperature sensor in communication with the interior of the load lock; a valve between the load lock and the vacuum pump; and a controller, in communication with the pressure sensor and the temperature sensor, wherein the controller calculates a supersaturation ratio within the load lock based on information from the pressure sensor and the temperature sensor, and wherein the controller controls the valve based on the supersaturation ratio. In some embodiments, the controller controls the valve such that the supersaturation ratio remains at or below a supersaturation ratio threshold, which is less than or equal to a critical value at which vapor condenses. In certain embodiments, the system comprises a humidity sensor, wherein the supersaturation ratio is determined based on information from the humidity sensor. In certain embodiments, a pump down time is less than twice a theoretical minimum pump down time, wherein the theoretical minimum pump down time is defined as a time to pump down the load lock from atmospheric pressure to vacuum conditions while the supersaturation ratio within the load lock remains constant at a critical value at which vapor condenses.

According to another embodiment, a semiconductor processing system is disclosed. The semiconductor processing system comprises a semiconductor processing tool and the system described above.

BRIEF DESCRIPTION OF THE FIGURES

For a better understanding of the present disclosure, reference is made to the accompanying drawings, which are incorporated herein by reference and in which.

DETAILED DESCRIPTION

As described above, in certain embodiments, workpieces are processed within a high vacuum environment. To process the workpieces, the workpieces are placed in a load lock, which is then pumped down to near vacuum conditions. The workpieces are then removed from the load lock and processed. These processed workpieces are then placed back in the load lock. The load lock is vented, and the workpieces are then removed at atmospheric pressure.

Figure 1:
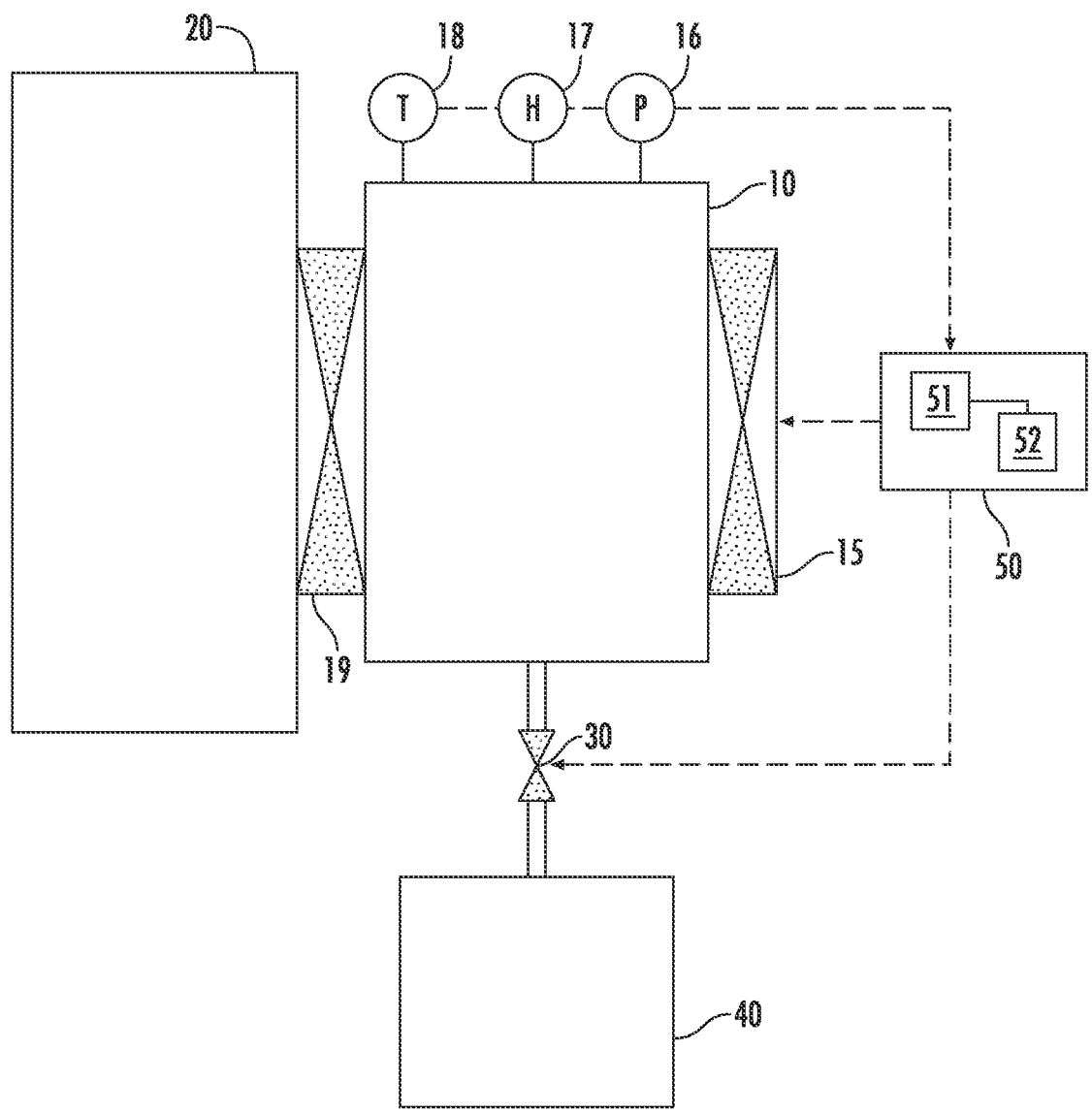
FIG. 1 is a system schematic view that illustrates the load lock chamber according to one embodiment.

FIG. 1 shows a load lock 10 connected to a semiconductor processing tool 20. The load lock 10 allows for semiconductor workpieces, such as wafers, to be loaded into the semiconductor processing tool 20 through the door 15 of the load lock 10. The semiconductor processing tool 20 may be any of various processing equipment tools used in the semiconductor manufacturing industry. Semiconductor processing tool 20 may be a high vacuum tool in which workpieces are processed in near vacuum conditions or at very low pressures. Semiconductor processing tool 20 may be an ion implanter, an etching tool, a deposition tool or any of various other tools used in the semiconductor device fabrication industry. The type of semiconductor processing tool 20 is not limited by this disclosure.

The semiconductor workpieces, which are typically in the form of wafers, first pass through the load lock 10 in order to get to the high vacuum processing portion of the semiconductor processing tool 20. First, the door 15 is opened to allow the unprocessed workpieces to be inserted inside with a robot arm or other mechanical device. Next, the door 15 is closed and the air within the load lock 10 is removed by opening a valve 30, which is in communication with the load lock 10 and a vacuum pump 40. Once the chamber inside the load lock 10 has been pumped to high vacuum, a slot valve 19 opens up to allow a robot arm to extract the workpieces from the load lock 10 and put them into the process chamber of the semiconductor processing tool 20 for processing. After the workpieces have been processed and returned to the load lock 10, the slot valve 19 is closed and the chamber of the load lock 10 is vented to return the chamber back to atmospheric pressure for removal from the semiconductor processing tool 20.

In certain embodiments, various sensors may be used to measure parameters within the load lock. For example, there may be any combination of a pressure sensor 16, a humidity sensor 17 and/or a temperature sensor 18. In certain embodiments, a Pirani transducer may be used as the pressure sensor 16, and a resistance temperature detector (RTD) may be used as the temperature sensor 18.

A controller 50 may be in communication with the sensors that are being used, which may include pressure sensor 16, the humidity sensor 17, the temperature sensor 18. Further, the controller 50 may be in communication with the valve 30. The valve 30 may be a variable control valve, such that the valve is capable of varying its opening so that various pumping speeds may be achieved. In other words, based on the size of the opening in the valve, the pumping speed achieved by the vacuum pump 40 is varied. In certain embodiments, valve 30 may be a butterfly valve or a ball valve.

The controller 50 includes a processing unit 51, such as a general purpose computer, a specifically designed microcontroller, or any other suitable processing unit. The processing unit 51 is in communication with a memory element 52, also referred to as computer memory, which stores instructions to be executed by the processing unit. These instructions may allow the controller 50 to perform the functions described herein. In operation, the controller 50 may optionally receive pressure readings from the pressure sensor 16, humidity readings from the humidity sensor 17 and/or temperature readings from the temperature sensor 18 and output control signals to the valve 30 which regulate the pumping speed. The computer memory may also be used to store various parameter values during operation. In addition, the memory element 52 may store one or more profiles, as described in more detail below.

As noted above, condensation may occur if the supersaturation ratio exceeds the critical value. Therefore, in certain embodiments, the controller 50 creates a pumping speed profile that does not allow the supersaturation ratio to exceed that critical value. Specifically, a pumping speed profile is utilized when the load lock is transitioned from a state of higher pressure, such as atmospheric pressure, to a state of low pressure, such as less than 0.1 Torr.

According to one embodiment, the environmental conditions within the load lock 10 may be approximated using differential equations. Specifically, it is known that the air density in the load lock may be expressed as:

$$\frac{d\rho}{dt} = -\rho * \frac{S_p}{V}$$

where $\rho$ is the density of the air within the load lock;
$S_p$ is the pumping speed; and
V is the volume of the load lock.

It is also known that pressure is directly related to density by the following expression:

$$P = \frac{\rho RT}{M}$$

where P is the pressure within the load lock;
R is the universal gas constant;
T is the temperature in the load lock; and
M is the molecular weight of the air in the load lock.

Further, it is known that the temperature within the load lock may be expressed as:

$$\frac{dT}{dt} = \frac{hA}{\rho C_v V} * (T_{wall} - T) - (\gamma - 1) * T * \frac{S_p}{V}$$

where T is the temperature within the load lock;
h is the convective heat transfer coefficient;
A is the surface area of the interior surfaces of the load lock;
$C_v$ is the specific heat of the air in the load lock at constant volume;
$T_{wall}$ is the temperature of the walls of the load lock; and
γ is the ratio of the specific heats defined as $$\frac{C_p}{C_v},$$

wherein Cp is the specific heat of the air at constant pressure.

Once these equations are solved for density (p), pressure (P) and temperature (T), the supersaturation ratio may be found. The supersaturation ratio is defined as the partial pressure of the water vapor divided by the saturation vapor pressure, where saturation vapor pressure is a function of temperature. Curves that show saturation vapor pressure as a function of temperature are readily available. Thus, the supersaturation ratio at any point in time may be given as:

$$S(t) = \frac{P_v(t)}{P_{sat}(T(t))} = \frac{P_v(0) * \frac{P(t)}{P(0)}}{P_{sat}(T(t))}$$

where $P_v(t)$ is the partial vapor pressure as a function of time;
$P_v(0)$ is the partial vapor pressure before pumping is started, which may be equivalent to the relative humidity;
P(0) is the pressure before pumping is started;
P(t) is the pressure in the load lock as a function of time;
T(t) is the temperature in the load lock as a function of time; and
$P_{sat}(T(t))$ is the saturation vapor pressure at the current temperature in the load lock.

Note that $P_v(0)$ can be written as:

$$P_v(0) = RH(0) * P_{sat}(0);$$

where RH(0) is the initial relative humidity; and
$P_{sat}(0)$ is the initial saturation vapor pressure.

Thus, the supersaturation ratio may also be expressed as:

$$S(t) = \frac{P_v(t)}{P_{sat}(T(t))} = RH(0) * \frac{P_{sat}(0) * \frac{P(t)}{P(0)}}{P_{sat}(T(t))}$$

Note that $P_v(0)$ is a function of the initial relative humidity in the chamber. Having estimated the supersaturation ratio in the load lock as it is being pumped, the pumping speed may be modified to ensure that the supersaturation ratio never exceeds the critical value at which the vapor condenses. In some embodiments, the supersaturation ratio never exceeds a supersaturation ratio threshold, which is less than or equal to the critical value.

One approach to ensure that the supersaturation ratio never exceeds the supersaturation ratio threshold is to utilize a closed loop controller, such as a PID controller, a PI controller, or a PD controller. Generically, using a PID controller, the pumping speed may be defined as:

$$S_p(t) = K_P * e(t) + K_I * \int e(t)dt + K_D * \frac{de(t)}{dt};$$

Where $K_P$, $K_I$ and $K_D$ are the gain coefficients for the PID controller; and
e(t) is the error signal and is defined as e(t)=$S_{target}$−S(t), where $S_{target}$ is the supersaturation ratio threshold.

In certain embodiments, the supersaturation ratio threshold may be a constant value. In other embodiments, the supersaturation ratio threshold may vary during the pumpdown process. For example, the supersaturation ratio threshold may change as a function of the temperature or pressure within the load lock.

The coefficients of the PID controller may be selected such that there is no overshoot, so that the e(t) error function is never negative. In some embodiments, the controller may be simplified. For example, by setting one of the coefficients to zero, a PI or PD controller may be used as well. Of course, other types of closed loop controllers may be employed.

Figure 2A:
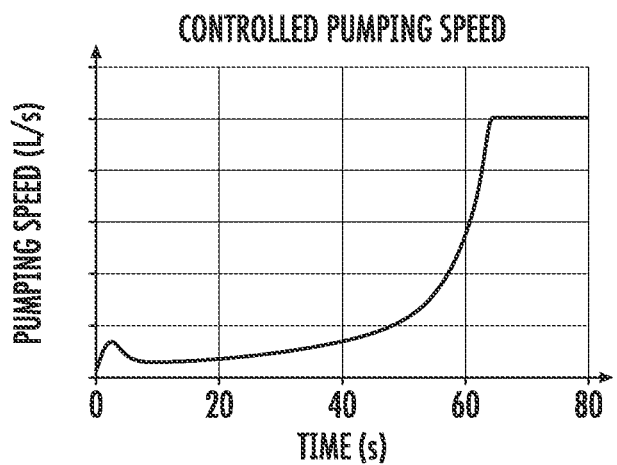
FIGS. 2A-2C show the pumping speed profile, the environmental parameters and the supersaturation ratio, respectively, as a function of time, according to one embodiment.
Figure 2B:
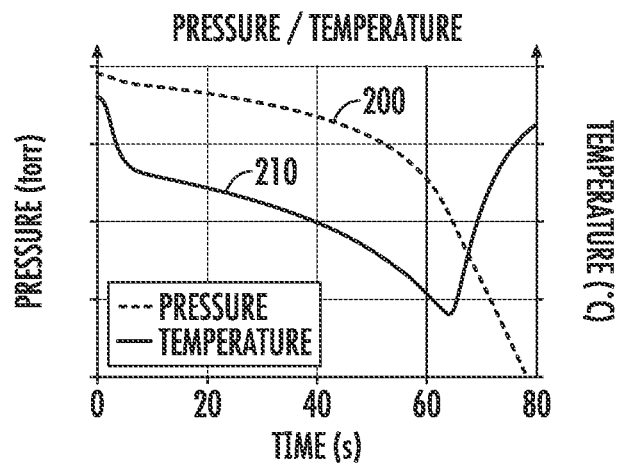
Figure 2C:
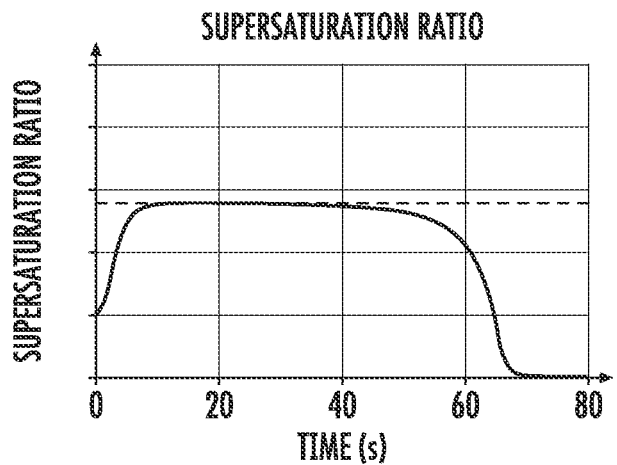

In one embodiment, a computer model is developed to describe the environmental conditions within the load lock as a function of pumping speed and time. The output from this computer model can then be used to calculate the supersaturation ratio within the load lock 10. A closed loop controller may then use a supersaturation ratio threshold and the calculated supersaturation ratio to create a pumping speed profile. For example, FIG. 2A shows a pumping speed profile that was generated using the computer model and equations shown above. FIG. 2B shows the environmental conditions, as calculated by the computer model, in the load lock 10 as the load lock is being pumped down. Specifically, the pressure 200 and the temperature 210 in the load lock 10 are presented. FIG. 2C shows the supersaturation ratio as a function of time. In this example, the closed loop controller was defined such that the supersaturation ratio never exceeded a predetermined supersaturation ratio threshold. This supersaturation ratio threshold may be any desired value, such as a value than may be 2.0 or less, or 1.5 or less.

Referring to FIG. 2C, it can be seen that the pumping speed profile never exceeded the supersaturation ratio threshold. In this disclosure, an efficiency factor is defined. The efficiency factor relates two quantities. The first quantity is the area under the supersaturation ratio vs. time curve, such as that in FIG. 2C. The second quantity is the area of the rectangle having a height equal to the supersaturation ratio threshold and a width equal to the time duration needed for the load lock to pump down from atmospheric pressure to 0.1 Torr. The efficiency ratio is defined as the ratio of the first quantity to the second quantity. In an ideal pump down profile, the environmental conditions within load lock would remain at the supersaturation ratio until the load lock was fully pumped down. This would result in the first quantity being equal to the second quantity, or an efficiency factor of 1.0.

Note that efficiency factor is related to the theoretical minimum pump down time. Specifically, the theoretical minimum pump down time is achieved with a pumping speed profile with an efficiency factor of 1.0. In other words, the theoretical minimum pump down time is defined as the time to pump down the load lock from atmospheric pressure to vacuum conditions while the supersaturation ratio within the load lock remains constant at the critical value. In some embodiments, vacuum conditions may be defined as less than 1 torr. In other embodiments, vacuum conditions may be defined as less than 0.1 torr.

Decreases in efficiency factor result in an increase in actual pump down time. In some embodiments, the systems and methods described herein create a pumping speed profile that achieves an efficiency factor of greater than 0.4, and the supersaturation ratio does not exceed the critical value. This may equate to a pump down time that is less than 2.5 times the theoretical minimum pump down time. In certain embodiments, the systems and methods described herein create a pumping speed profile that achieves an efficiency factor of greater than 0.5, and the supersaturation ratio does not exceed the critical value. This may equate to a pump down time that is less than two times the theoretical minimum pump down time. In other embodiments, the systems and methods described herein allow a pumping speed profile that achieves an efficiency factor of greater than 0.7, and the supersaturation ratio does not exceed the critical value. This may equate to a pump down time that is less than 1.5 times the theoretical minimum pump down time.

It should be noted that when a PID controller is used, the pumping speed profile may vary depending on the selection of $K_P$, $K_I$ and $K_D$, while still remaining below the supersaturation ratio threshold. Thus, FIG. 2A is illustrative of one pumping speed profile that may be used, although there are many others. Further, in this example, the pumping speed profile was created using a PI controller. Other pumping speed profiles may be generated using a PID or PD controller.

Note that the pumping speed profile shown in FIG. 2A may be replicated by the controller 50 without the need for any feedback. Thus, in certain embodiments, the controller 50 operates in open loop, using no actual feedback from the load lock 10. Rather, the controller 50 simply matches the actual pumping speed at each point in time to the pumping speed profile shown in FIG. 2A (or any other suitable pumping speed profile). This may be done by the control of the valve 30.

Thus, in some embodiments, the controller 50 does not utilize any inputs from the pressure sensor 16, the humidity sensor 17 or the temperature sensor 18. Rather, initial conditions, such as the temperature of the walls of the load lock 10 and the relative humidity, may simply be assumed to be nominal values, such as 22° C. and 50% R.H., respectively.

Further, while the above describes the use of ordinary differential equations to simulate the environment within the load lock 10, other modelling techniques may be used. For example, computational fluid dynamics (CFD) may be used to determine the environmental conditions and these environmental conditions may be used in conjunction with a closed loop controller to calculate the pumping speed profile.

Figure 3:
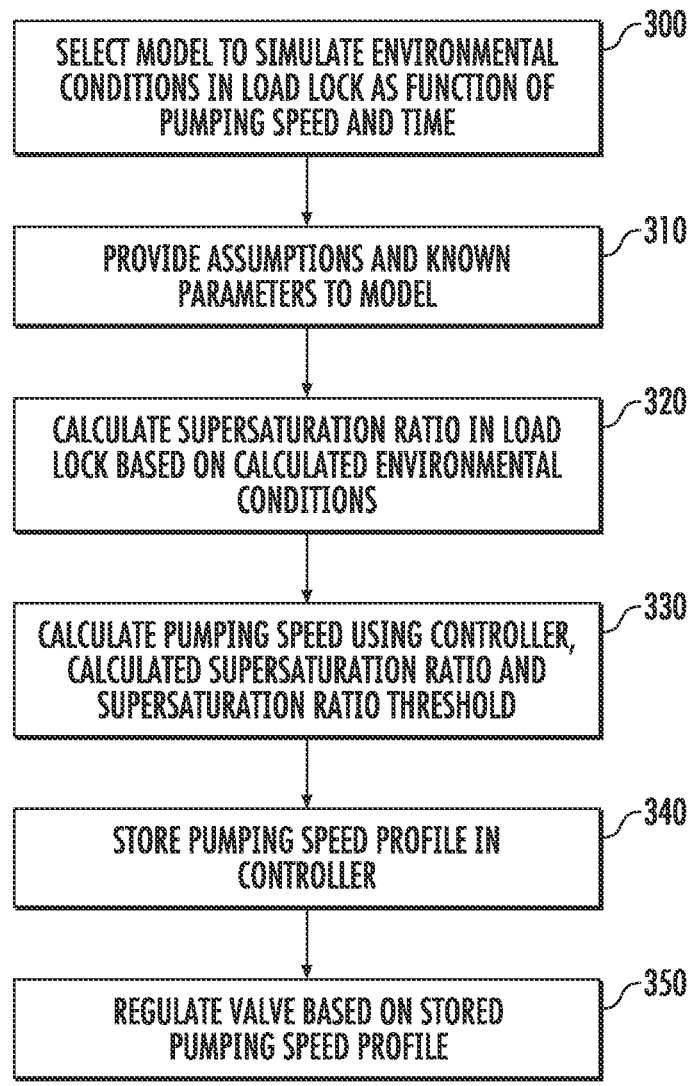
FIG. 3 shows a sequence that may be used to create a pumping speed profile according to one embodiment.

Thus, in this embodiment, the sequence of operations may be as shown in FIG. 3. First, as shown in Box 300, a computer model is selected. This model may be ODE (ordinary differential equations) or CFD (computational fluid dynamics) or another model. This computer model is used to calculate the environmental conditions within the load lock 10 as a function of pumping speed and time. Next, known parameters and assumptions may be entered into the computer model, as shown in Box 310. These known parameters and assumptions may include the surface area of the interior of the load lock, the temperature of the surfaces in the load lock, the relative humidity, the volume within the load lock 10, and various other parameters, such as the natural convection heat transfer coefficient, the specific heat of air at constant volume, and the specific heat of air at constant pressure. Note that some computer models may not use all of these parameters. This computer model is used to calculate the temperature and pressure within the load lock 10 at any point in time as a function of pumping speed. From this information, the supersaturation ratio within the load lock 10 at any point in time may also be calculated, as shown in Box 320. A supersaturation ratio threshold is selected.

Note that this may be performed before the previous processes. Next, a pumping speed profile is created using the equations above, the supersaturation ratio and the supersaturation ratio threshold and a closed loop controller, such as a PID, PI or PD controller, as shown in Box 330. Specifically, for each time interval, based on the calculated supersaturated ratio and the supersaturation ratio threshold, the closed loop controller computes a desired pumping speed. This new value is then input into the differential equations to calculate a new temperature and pressure. This new temperature and pressure are then used to calculate the new supersaturation ratio.

Note that Boxes 300-330 may be performed by the controller 50, or by a different processing unit. If performed by the controller 50, the closed loop controller may be implemented in software in the controller 50, or may be a separate hardware block within the controller 50. If Boxes 300-330 are performed by a different processing unit, this processing unit may be a special purpose PID controller, or may be a computer that is programmed to perform the operations of the closed loop controller. In either embodiment, the resulting pumping speed profile is stored in the controller 50, as shown in Box 340.

Note that while the use of a closed loop controller is described above, other techniques may be used. For example, the pumping speed profile may be calculated manually based on the computer model.

Lastly, as shown in Box 350, the controller 50 regulates valve 30 such that the actual pumping speed matches that from the pumping speed profile. As noted above, this may be considered an open loop control, as the actual pressure and temperature of the load lock 10 are not used by the controller 50 in its regulation of the valve 30.

As a variation of FIG. 3, a plurality of different pumping speed profiles may be generated using the process shown in Box 330, wherein each pumping speed profile is based on a different relative humidity. For example, as described above, the equation for the supersaturation ratio is dependent on the initial relative humidity in the load lock 10. Thus, different values of the relative humidity will yield different results. Thus, in another embodiment, in Box 340, a plurality of pumping speed profiles are stored in the controller 50, each designed for a predetermined relative humidity. The controller 50 is then supplied with the relative humidity in the load lock 10. This may be done using the humidity sensor 17, or may be input from an operator. The controller 50 may then utilize the pumping speed profile that was generated with a relative humidity that is closest to the inputted relative humidity. In certain embodiments, the pumping speed profile that is chosen may be the one generated with the lowest relative humidity that is greater than or equal to the inputted relative humidity. For example, if the controller 50 stores 5 pumping speed profiles, established for 20%, 30%, 40%, 50% and 60% relative humidity and the inputted humidity is 37%, the controller 50 may select the pumping speed profile that was generated at 40%. In this way, the supersaturation ratio within the load lock 10 will be less than that assumed in the selected profile.

Figure 4A:
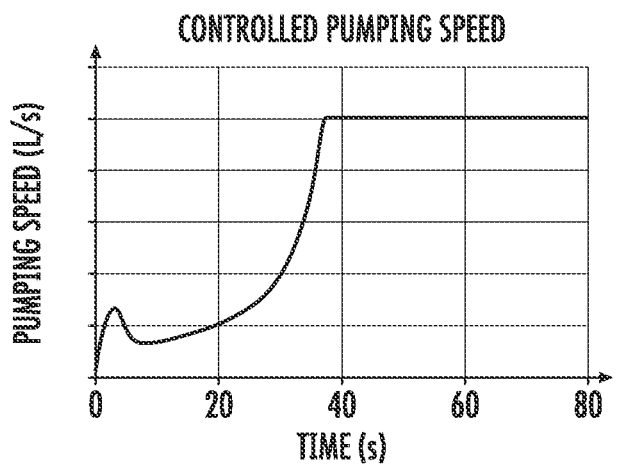
FIGS. 4A-4C show the pumping speed profile, the environmental parameters and the supersaturation ratio, respectively, as a function of time, according to another embodiment.
Figure 4B:
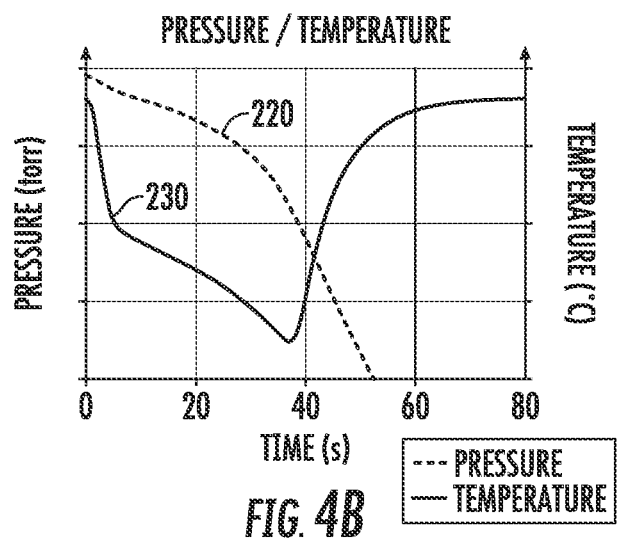
Figure 4C:
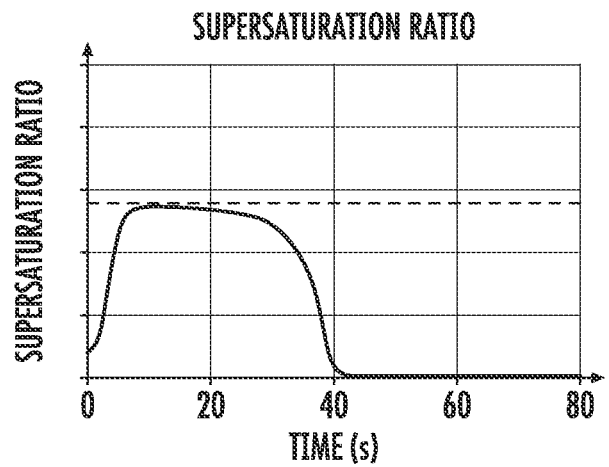

The use of relative humidity as an input may help to increase throughput. FIGS. 2A-2C assumed a relative humidity of 50%. This resulted in a pump down time of about 65 seconds. FIGS. 4A-4C assume a relative humidity of 20%. FIG. 4A shows the pumping speed profile as a function of time. FIG. 4B shows the environmental parameters, including pressure 220 and temperature 230 as a function of time. FIG. 4C shows the supersaturation ratio as a function of time. Note that because the starting relative humidity was much lower, the pump down time was reduced by about 25 seconds. This may result in an increase in throughput through the load lock of over 30%.

Thus, in this embodiment, the controller 50 stores a plurality of pumping speed profiles and selects one of these profiles based on an inputted parameter. While the above example assumed that relative humidity was the inputted parameter, other parameters may also be input. These include the temperature of the load lock 10.

Further, it is noted that, based on the pumping speed profile, temperature or pressure profiles may also be generated. For example, rather than controlling the pumping speed directly, the controller 50 may control the valve 30 to achieve a desired pressure profile. Thus, in addition to or as an alternative to, a plurality of pressure profiles may be saved in the controller 50 and used to control the valve 30.

In another embodiment, the controller 50 utilizes feedback from a pressure sensor 16, a humidity sensor 17 and/or a temperature sensor 18 to regulate the valve 30. For example, if the pressure sensor 16, the humidity sensor 17 and the temperature sensor 18 are present, the controller 50 can readily calculate the supersaturation ratio at any point in time. This supersaturation ratio may then be utilized by a closed loop controller, such as a PID, PI or PD controller to determine the desired pumping speed at that time.

Figure 5:
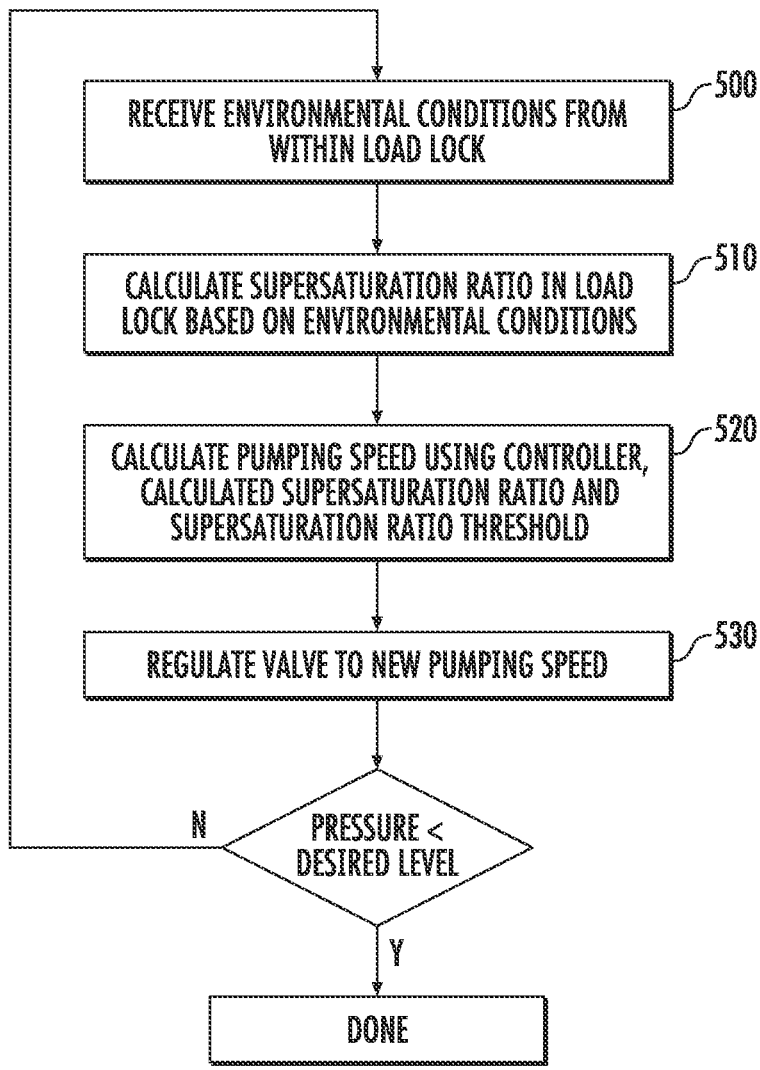
FIG. 5 shows a sequence that may be used to create a pumping speed profile according to a second embodiment.

In other words, as shown in FIG. 5, the controller 50 receives the humidity, temperature and pressure as inputs, as shown in Box 500. The controller 50 then calculates the supersaturation ratio at that time, as shown in Box 510. The calculated supersaturation ratio and the supersaturation ratio threshold are then used as inputs to a closed loop controller, such as a PID, PD or PI controller, to calculate the desired pumping speed, as shown in Box 520. The controller 50 then regulates the valve 30 to achieve this pumping speed, shown in Box 530. The sequence then repeats until the pressure reaches the desired level, at which point, the slot valve 19 can be opened.

Thus, in this embodiment, the controller 50 uses closed loop control to regulate the pumping speed. Specifically, the controller 50 measures the environmental conditions within the load lock 10, calculates the supersaturation ratio based on those conditions and then adjusts the valve 30 accordingly.

In yet another embodiment, the controller 50 may utilize a hybrid approach where the computer model is used in conjunction with one or more sensor values to determine the environmental conditions within the load lock 10. For example, as seen in FIGS. 2B and 4B, the pressure changes relatively slowly, as compared to temperature. Therefore, it may be possible to utilize a pressure sensor 16 to monitor pressure. The measured value of pressure can then be used as an input to the computer model. For example, the measured pressure and current pumping speed may be used to determine the current temperature in the load lock 10. Using the measured pressure and calculated temperature, the supersaturation ratio can be computed. This supersaturation ratio can then be used by the controller to calculate a new pumping speed.

Figure 6:
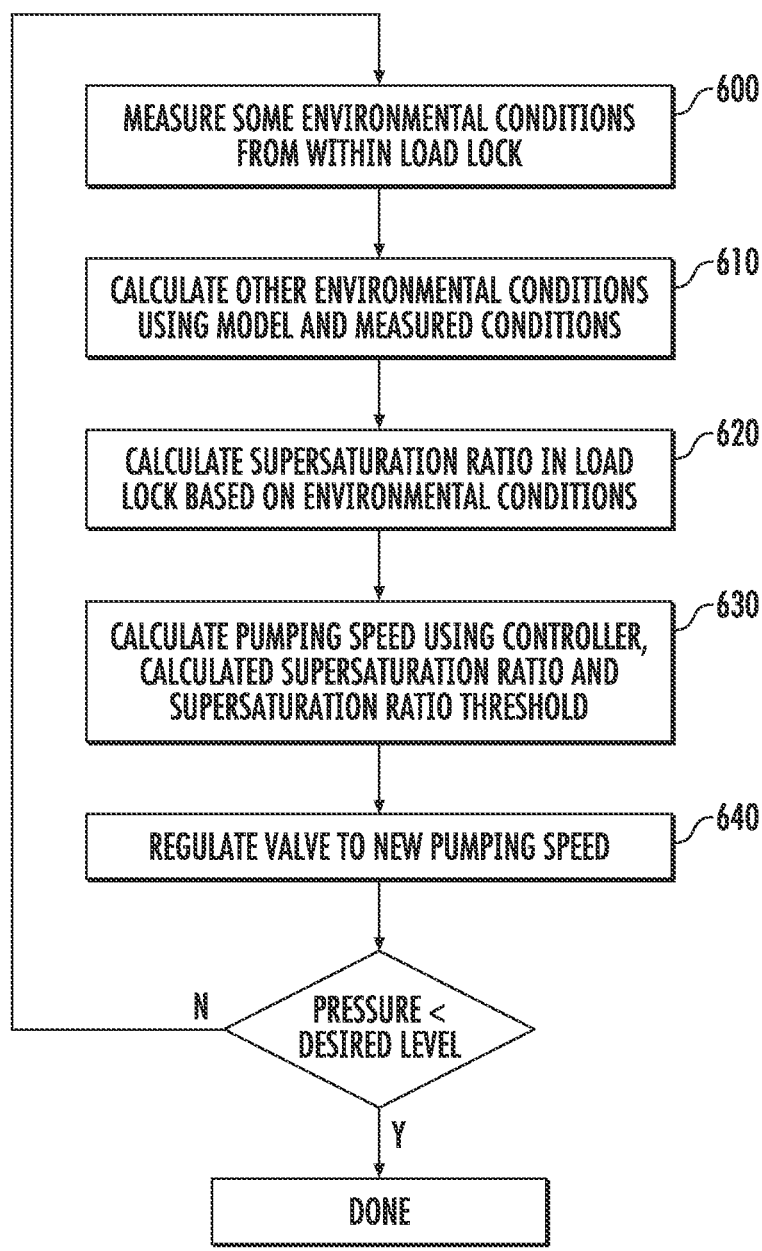
FIG. 6 shows a sequence that may be used to create a pumping speed profile according to a third embodiment.

FIG. 6 shows the sequence associated with this approach. As shown in Box 600, one or more environmental conditions in the load lock 10 are measured and supplied to the controller 50. Based on the measured conditions and the computer model, the remaining environmental conditions may be calculated, as shown in Box 610. Once all of the environmental conditions have been measured or calculated, the supersaturation ratio may be computed, as shown in Box 620. The calculated supersaturation ratio and the supersaturation ratio threshold are then used as inputs to a closed loop controller, such as a PID, PD or PI controller, to calculate the desired pumping speed, as shown in Box 630. The controller 50 then regulates the valve 30 to achieve this pumping speed, shown in Box 640. The sequence then repeats until the pressure reaches the desired level, at which point, the slot valve 19 can be opened.

Thus, in this scenario, the controller 50 uses both measured environmental conditions and calculated environmental conditions to compute the supersaturation ratio. The calculated supersaturation ratio and the supersaturation ratio threshold are then used to determine the appropriate pumping speed. The controller 50 then regulates the valve 30 according to the pumping speed.

In yet another embodiment that utilizes a hybrid model, a pressure sensor 16 may be employed. In this embodiment, a computer model is used to create the pumping speed profile as described above and shown in FIG. 3. Based on this pumping speed profile, a pressure profile may then be created, such as the graph of pressure 200 shown in FIG. 2B. This pressure profile may then be stored in the controller 50. The controller 50 then compares the pressure as measured by the pressure sensor 16 to the pressure profile. Based on this difference, a new pumping speed may be determined. This pumping speed may be generated using a closed loop controller, as described above, where the error function may be defined as the difference between the pressure in the pressure profile and the actual pressure in the load lock, as measured by the pressure sensor 16. Thus, in this embodiment, the controller utilizes a theoretical pressure profile in conjunction with the actual pressure measurements to control the valve 30.

In a variation of this approach, a plurality of pressure profiles are stored in the controller 50, each designed for a predetermined relative humidity. The controller 50 is then supplied with the relative humidity in the load lock 10. This may be done using the humidity sensor 17, or may be input from an operator. The controller 50 may then utilize the pressure profile that was generated with a relative humidity that is closest to the inputted relative humidity.

The embodiments described above in the present application may have many advantages. In environments with high relative humidity, it is possible that the supersaturation ratio within the load lock rises to unacceptable levels, causing water particles to be deposited on the workpieces. These water particles may result in defects when the workpiece is processed. However, simply slowing the pumping speed to maintain a lower supersaturation ratio within the load lock costs valuable time and affects throughput. By using the supersaturation ratio within the load lock (either measured or calculated using a computer model), the pumping speed profile may be tailored to ensure that water particles are not formed and the duration of time used to pump down the load lock is kept reasonable.

For example, in certain current systems, the pumping speed profile is used. At high relative humidity, this pumping speed profile is modified to prevent condensation by reducing the pumping speed. In one test, the pump down time was increased by 100 seconds to eliminate condensation. By utilizing a pumping speed profile based on maintaining the supersaturation ratio below the critical value, faster pump down times may be achieved. For example, this faster pump down time may eliminate the additional 100 seconds described above. Further, as described above, the system and method described herein may allow the load lock to be pumped down in a time that is less than twice the theoretical minimum pump down time, while the supersaturation ratio within the load lock does not exceed a supersaturation ratio threshold. In some embodiments, a pump down time that is less than 1.5 times the theoretical minimum pump down time. In contrast, current systems typically have a pump down time that may be in excess of three times the theoretical minimum pump down time.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for introducing workpieces to a semiconductor processing tool, comprising:
   a load lock;
   a vacuum pump;
   a valve between the load lock and the vacuum pump; and
   a controller, comprising a memory element storing a plurality of profiles, each profile associated with a respective relative humidity; wherein an operating relative humidity is supplied to the controller, the controller selects one of the plurality of profiles based on the operating relative humidity, referred to as a selected profile; and controls the valve based on the selected profile;
   wherein the profile is created using a computer model and the computer model is created so as to maintain a supersaturation ratio within the load lock at or below a supersaturation ratio threshold, which is less than or equal to a critical value at which vapor condenses.

2. The system of claim 1, wherein the profile comprises a pumping speed profile.

3. The system of claim 1, wherein the computer model is created using differential equations.

4. The system of claim 1, wherein the computer model is created using computational fluid dynamics.

5. A semiconductor processing system comprising:
   a semiconductor processing tool; and
   the system of claim 1.

6. The system of claim 1, wherein the profile comprises a pressure profile.

7. The system of claim 6, further comprising a pressure sensor in communication with an interior of the load lock, wherein the controller controls the valve based on a pressure measured by the pressure sensor and the selected profile.

8. A system for introducing workpieces to a semiconductor processing tool, comprising:
   a load lock;
   a vacuum pump;
   a valve between the load lock and the vacuum pump; and
   a controller, comprising a memory element storing a profile, the profile created by a computer model such that a supersaturation ratio within the load lock is maintained at or below a supersaturation ratio threshold, which is less than or equal to a critical value at which vapor condenses and such that a pump down time is less than twice a theoretical minimum pump down time, wherein the theoretical minimum pump down time is defined as a time to pump down the load lock from atmospheric pressure to vacuum conditions while the supersaturation ratio within the load lock remains constant at the critical value; wherein the controller controls the valve based on the profile.

9. The system of claim 8, wherein the profile comprises a pressure profile.

10. The system of claim 9, further comprising a pressure sensor in communication with an interior of the load lock, wherein the controller controls the valve based on a pressure measured by the pressure sensor and the profile.

11. The system of claim 8, wherein the profile comprises a pumping speed profile.

12. The system of claim 8, wherein the computer model is created using differential equations.

13. The system of claim 8, wherein the computer model is created using computational fluid dynamics.

14. A system for introducing workpieces to a semiconductor processing tool, comprising:
    a load lock;
    a vacuum pump;
    a pressure sensor in communication with an interior of the load lock;
    a temperature sensor in communication with the interior of the load lock;
    a valve between the load lock and the vacuum pump; and
    a controller, in communication with the pressure sensor and the temperature sensor, wherein the controller calculates a supersaturation ratio within the load lock based on information from the pressure sensor and the temperature sensor, and wherein the controller controls the valve based on the supersaturation ratio.

15. The system of claim 14, wherein the controller controls the valve such that the supersaturation ratio remains at or below a supersaturation ratio threshold, which is less than or equal to a critical value at which vapor condenses.

16. The system of claim 15, further comprising a humidity sensor, wherein the supersaturation ratio is determined based on information from the humidity sensor.

17. The system of claim 14, wherein a pump down time is less than twice a theoretical minimum pump down time, wherein the theoretical minimum pump down time is defined as a time to pump down the load lock from atmospheric pressure to vacuum conditions while the supersaturation ratio within the load lock remains constant at a critical value at which vapor condenses.

18. A semiconductor processing system comprising:
a semiconductor processing tool; and
the system of claim 14.

* * * * *